(12) United States Patent
Takaishi (10) Patent No.: US 9,379,233 B2
(45) Date of Patent: Jun. 28, 2016

(54) SEMICONDUCTOR DEVICE (71) Applicant: PS4 Luxco S.a.r.l., Luxembourg (LU)

(72) Inventor: Yoshihiro Takaishi, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 0 days.

(21) Appl. No.: 14/872,844

(22) Filed: Oct. 1, 2015

(65) Prior Publication Data

US 2016/0020316 A1 Jan. 21, 2016

Related U.S. Application Data

(63) Continuation of application No. 13/722,125, filed on Dec. 20, 2012, now Pat. No. 9,178,056.

(30) Foreign Application Priority Data

Dec. 27, 2011 (JP) .................................. 2011-285544

(51) Int. Cl.
*H01L 29/78* (2006.01)
*H01L 29/66* (2006.01)
*H01L 27/088* (2006.01)
*H01L 21/8234* (2006.01)

(52) U.S. Cl.
CPC .......... *H01L 29/7802* (2013.01); *H01L 27/088* (2013.01); *H01L 29/66666* (2013.01); *H01L 29/7813* (2013.01); *H01L 29/7827* (2013.01); *H01L 21/823487* (2013.01)

(58) Field of Classification Search
CPC ..................... H01L 29/7802; H01L 29/66666; H01L 27/088; H01L 29/7827; H01L 29/7813; H01L 21/823487
See application file for complete search history.

(56) References Cited

U.S. PATENT DOCUMENTS

| 6,584,566 | B1 | 6/2003 | Hardjono |
| 6,813,714 | B1 | 11/2004 | Hardjono et al. |
| 7,945,272 | B2 | 5/2011 | Kim |
| 2003/0044020 | A1 | 3/2003 | Aboba et al. |
| 2003/0177267 | A1 | 9/2003 | Orava et al. |
| 2006/0063548 | A1 | 3/2006 | Kim |
| 2007/0071021 | A1 | 3/2007 | Girao |
| 2009/0024848 | A1 | 1/2009 | Takasugi et al. |
| 2010/0011063 | A1 | 1/2010 | Blaiotta et al. |
| 2011/0072121 | A1 | 3/2011 | Takasugi et al. |

FOREIGN PATENT DOCUMENTS

| JP | 2006-081184 | 3/2006 |
| JP | 2007-089156 | 4/2007 |
| JP | 2008-257340 | 10/2008 |
| JP | 2008-543137 | 11/2008 |
| JP | 2009-081389 | 4/2009 |
| WO | WO2007/072814 | 6/2007 |

*Primary Examiner* — William Coleman (57) ABSTRACT

A semiconductor device 100 includes a plurality of vertical transistors 50 provided to stand from a silicon substrate 1 and having a pillar lower diffusion layer 9 at their end portions on the silicon substrate 1 side, a metal contact plug 31 provided to stand from the silicon substrate 1 and connected to the pillar lower diffusion layer 9 of the plurality of vertical transistors 50, the plurality of vertical transistors 50 are uniformly arranged around the metal contact plug 31 and share the pillar lower diffusion layer 9 and the metal contact plug 31.

4 Claims, 10 Drawing Sheets

SEMICONDUCTOR DEVICE

This application is a continuation of, and claims priority to, U.S. patent application Ser. No. 13/722,125 filed on Dec. 20, 2012, which claims the benefit of priority from Japanese Patent Application No. 2011-285544, filed on Dec. 27, 2011, the disclosure of each of which is incorporated herein in its entirety by reference.

BACKGROUND OF THE INVENTION

1. Field of the Invention

This invention relates to a semiconductor device.

2. Description of Related Art

In recent years, vertical transistors have been proposed as a technique for transistor miniaturization.

The vertical transistor is a transistor which uses as a channel a semiconductor pillar extending in a direction perpendicular to a main surface of a semiconductor substrate.

Specifically, as disclosed in, for example, JP-A-2009-081389 (Patent Document 1), in a vertical transistor, a semiconductor pillar (base pillar) is provided to stand from a semiconductor substrate and a gate electrode is provided around the semiconductor pillar with a gate insulating film interposed therebetween. A drain region and a drain electrode are provided on the side of a lower portion of the semiconductor pillar while a source region and a source electrode are provided at an upper portion of the semiconductor pillar.

As compared with a conventional transistor in which a channel is disposed parallel to the substrate plane, the area in the plane occupied by the vertical transistor is smaller and, even if the channel length (gate length) is increased, there is no increase in transistor occupation area in the plane.

Consequently, it is possible to suppress the short channel effect without increasing the transistor occupation area in the plane. Further, the vertical transistor has an advantage that since the channel can be fully depleted, it is possible to obtain a satisfactory S value (subthreshold swing value) and a large drain current.

In addition, in the vertical transistor, since the gate electrode is formed over the entire periphery of the channel, i.e. the gate electrode covers the entire periphery of the channel, it is possible to effectively control the potential of the channel by a voltage applied to the gate electrode without being affected by external factors other than the source and the drain.

SUMMARY

Herein, in order to obtain a high current drive capability while maintaining the transistor characteristics, a vertical transistor type semiconductor device may be provided with a plurality of semiconductor pillars, wherein upper diffusion layers provided at upper portions of the semiconductor pillars are connected in parallel to each other and lower diffusion layers provided at lower portions of the semiconductor pillars are connected in parallel to each other. In this event, variation in electrical resistance between upper contact plugs, which are connected to the upper diffusion layers, and the semiconductor pillars is in an allowable range because, in terms of the structure in which the upper diffusion layers are provided at the upper ends of the semiconductor pillars, connecting positions of the upper contact plugs are limited. On the other hand, there has been a problem that electrical resistances between a lower contact plug, which is connected to the lower diffusion layers, and the semiconductor pillars largely differ depending on connecting positions between the lower diffusion layers and the lower contact plug and that if the maximum interval between the semiconductor pillar and the lower contact plug becomes more than twice the minimum interval between the semiconductor pillar and the lower contact plug in plan view, there occurs variation in characteristics of transistors provided to the semiconductor pillars.

Therefore, a semiconductor device has been desired which, even in a structure where a plurality of vertical transistors are connected to each other, can stabilize the characteristics of the transistors provided to individual semiconductor pillars.

In one embodiment, there is provided a semiconductor device comprising a plurality of vertical transistors provided to stand from a semiconductor substrate and comprising a diffusion layer at their end portions on the semiconductor substrate side; and a conductive plug provided to stand from the semiconductor substrate and connected to the diffusion layer of the plurality of vertical transistors, wherein the plurality of vertical transistors are uniformly arranged near the conductive plug and share the diffusion layer and the conductive plug.

In another embodiment, there is provided a semiconductor device comprising a semiconductor pillar provided to stand from a semiconductor substrate and forming a channel a gate insulating film and a gate electrode provided over a side surface of the semiconductor pillar an upper diffusion layer provided at an upper end of the semiconductor pillar and serving as one of a source and a drain a lower diffusion layer provided at a lower end of the semiconductor pillar and serving as the other of the source and the drain and a lower diffusion layer side contact plug connected to the lower diffusion layer, the plurality of semiconductor pillars share the lower diffusion layer and the lower diffusion layer side contact plug, and the semiconductor pillars are uniformly arranged near the lower diffusion layer side contact plug.

In still another embodiment, there is provided a semiconductor device comprising a semiconductor substrate comprising an active region on its surface, a plurality of vertical transistors provided in the active region so as to stand from the semiconductor substrate and comprising a lower diffusion layer at their end portions on the semiconductor substrate side and upper diffusion layers at their other end portions; and a conductive plug provided to stand from the semiconductor substrate and connected to the lower diffusion layer of the plurality of vertical transistors, wherein the plurality of vertical transistors are uniformly arranged near the conductive plug and share the upper diffusion layers and the lower diffusion layer so as to be connected in parallel to each other.

Effect of the Invention

According to this invention, it is possible to provide a semiconductor device which, even in a structure where a plurality of vertical transistors are connected to each other, can stabilize the characteristics of the transistors provided to individual semiconductor pillars.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF PREFERRED EMBODIMENTS

Hereinbelow, preferred embodiments of this invention will be described in detail with reference to the drawings.

First, referring to FIGS. 1, 2, and 3, a schematic structure of a semiconductor device 100 according to a first embodiment of this invention will be described.

Figure 1:
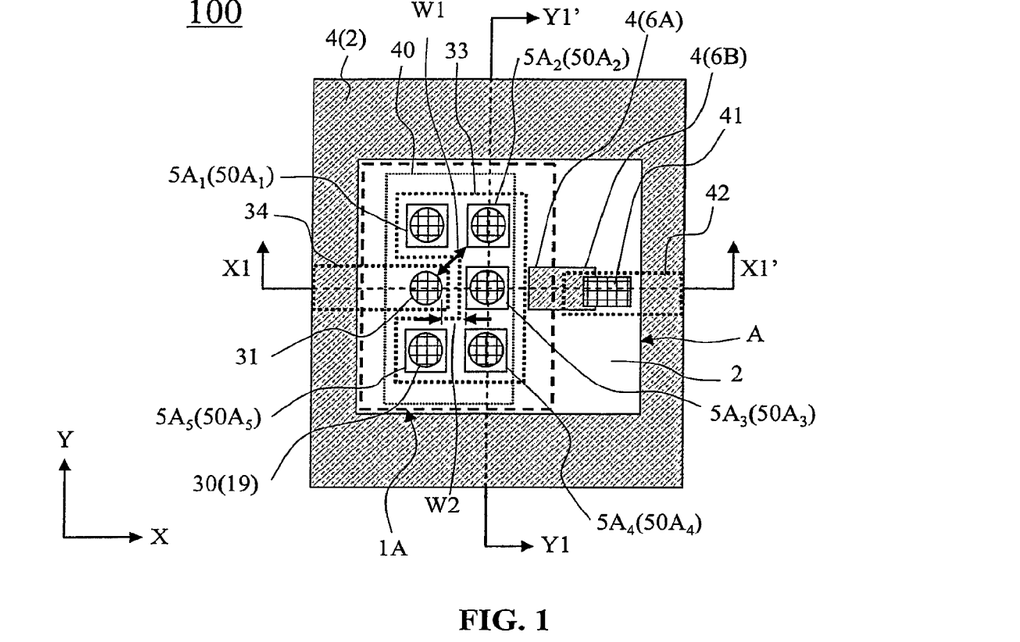
FIG. 1 is an exemplary diagram (plan view) showing the structure of a semiconductor device 100 according to a first embodiment of this invention, wherein, in order to clarify the arrangement of components, interconnections located on an interlayer insulating film and on contact plugs are shown in a see-through state with only their profiles given in dotted lines.

As shown in a plan view of FIG. 1, the semiconductor device 100 according to the first embodiment has, on a semiconductor substrate of silicon single crystal or the like, an STI (shallow trench isolation) 2 serving as an element isolation region, and an active region 1A (broken-line region) which is the semiconductor substrate surrounded by the STI 2. In the active region 1A, five vertical transistors, i.e. a first unit transistor $50A_1$, a second unit transistor $50A_2$, a third unit transistor $50A_3$, a fourth unit transistor $50A_4$, and a fifth unit transistor $50A_5$, are arranged in a ⊓-shape and protrude from a semiconductor substrate surface. An impurity diffusion layer is provided in a surface portion, located around the unit transistors, of the active region 1A and forms a lower diffusion layer shared by the vertical transistors. A metal contact plug 31 connected to the lower diffusion layer and shared by the vertical transistors is disposed in a central region of then ⊓-shape. Metal contact plugs 30 are disposed above the vertical transistors and are connected to each other by a metal interconnection 33 disposed in contact with upper surfaces of the metal contact plugs 30. Accordingly, the five vertical transistors share the lower diffusion layer and further share the metal interconnection 33 disposed above them. That is, the semiconductor device 100 forms a single vertical transistor in which the five vertical transistors are connected in parallel to each other. A pillar groove forming region A is arranged as an expanded region defined by moving one side surface of the active region 1A to the STI 2 side. As will be described later, a dummy pillar (gate-lift pillar) 6 for applying a gate voltage to gate electrodes of the five vertical transistors is disposed at the boundary between the active region 1A and the STI 2 in the pillar groove forming region A. The dummy pillar 6 comprises a first dummy pillar (gate-lift silicon pillar) 6A which is a silicon pillar disposed on the active region 1A side and a second dummy pillar (gate-lift insulating film pillar) 6B which is an insulating film pillar disposed on the STI 2 side. Facing side surfaces of the first and second dummy pillars 6A and 6B are in contact with each other, thereby forming an integral composite pillar.

Referring to FIG. 1, the structure of the semiconductor device 100 will be described in further detail.

The unit transistors are uniformly arranged around the metal contact plug 31. In the first embodiment, "uniformly arranged" represents an arrangement in which, in plan view, the distance between the metal contact plug 31 and a closest portion of the unit transistor farthest from the metal contact plug 31 is twice or less the distance between the metal contact plug 31 and a closest portion of the unit transistor closest to the metal contact plug 31. Each of silicon pillars 5 forming channels of the respective unit transistors has a rectangular shape in plan view in which a width in an X-direction (first direction) and a width in a Y-direction (second direction) perpendicular to the X-direction are equal to each other. Herein, the width is set to 50 nm. The shape of each silicon pillar 5 in plan view is not limited to rectangular and may be circular. In the case of the circular shape, the diameter is set to 50 nm.

As described above, the silicon pillars respectively form the channels of the unit transistors. That is, the five silicon pillars, i.e. the first silicon pillar $5A_1$, the second silicon pillar $5A_2$, the third silicon pillar $5A_3$, the fourth silicon pillar $5A_4$, and the fifth silicon pillar $5A_5$, respectively correspond to the five unit transistors, i.e. the first unit transistor $50A_1$, the second unit transistor $50A_2$, the third unit transistor $50A_3$, the fourth unit transistor $50A_4$, and the fifth unit transistor $50A_5$.

The five unit transistors are arranged in the ⊓-shape in plan view. That is, the two unit transistors, i.e. the first unit transistor $50A_1$ and the second unit transistor $50A_2$, are arranged at an interval therebetween so that their centers are located on the same line in the X-direction. Herein, this interval is set to 30 nm. Further, the three unit transistors, i.e. the second unit transistor $50A_2$, the third unit transistor $50A_3$, and the fourth unit transistor $50A_4$, are arranged at an interval therebetween so that their centers are located on the same line in the Y-direction. Herein, this interval is set to 30 nm. Further, the two unit transistors, i.e. the fourth unit transistor $50A_4$ and the fifth unit transistor $50A_5$, are arranged at an interval therebetween so that their centers are located on the same line in the X-direction. Herein, this interval is set to 30 nm. The first and second unit transistors $50A_1$ and $50A_2$ and the fifth and fourth unit transistors $50A_5$ and $50A_4$ are arranged at positions which are axisymmetric with respect to a line extending in the X-direction through the center of the third unit transistor $50A_3$. Consequently, the five unit transistors are arranged in the ⊓-shape.

Right above the unit transistors, silicon plugs 19, the metal contact plugs 30, and the metal interconnection 33 are disposed. Each unit transistor, the corresponding silicon plug 19, and the corresponding metal contact plug 30 are arranged so as to overlap each other in plan view in the same region. The metal interconnection 33 is arranged so as to extend in the XY-directions to thereby form ⊓-shape along the arrangement of the five unit transistors. The metal interconnection 33 is connected, through the silicon plugs 19 and the metal contact plugs 30, to pillar upper diffusion layers provided at upper portions of the silicon pillars to form the unit transistors and serves as power feed wiring to the unit transistors. In this manner, the five unit transistors are connected in parallel to each other by the metal interconnection 33, thereby forming a single parallel transistor.

On the other hand, the dummy pillar 6 of a rectangular shape in plan view is adjacently disposed at an interval from the third silicon pillar $5A_3$ in the X-direction and stands from the silicon substrate 1 and the STI 2. Herein, this interval is set to 30 nm. The dummy pillar 6 lies over the active region 1A and the STI 2 and comprises the first dummy pillar 6A standing on the active region 1A side formed by the silicon substrate 1 and the second dummy pillar 6B standing on the STI 2 side. One side surface of the first dummy pillar 6A is in contact with one side surface of the second dummy pillar 6B so as to be integrated together. Another side surface of the first dummy pillar 6A faces one side surface, located at a position closest to the first dummy pillar 6A, of the third silicon pillar $5A_3$. A metal contact plug 41 of a rectangular shape in plan view is disposed right above the second dummy pillar 6B. The metal contact plug 41 is arranged at a position partially overlapping the second dummy pillar 6B in plan view and slightly protrudes outward of the second dummy pillar 6B in the X-direction. In FIG. 1, as described above, the metal contact plug 41 is offset in the X-direction with respect to the second dummy pillar 6B, but the configuration is not limited thereto. The metal contact plug 41 may be offset in the Y-direction at an arbitrary position within a range that is free of contact with the silicon pillars.

On side surfaces of each silicon pillar, a gate electrode 11a is provided with a gate insulating film 10 interposed therebetween. The gate electrodes 11a are connected to each other by burying gaps (spaces) between the adjacent silicon pillars, thereby forming a single gate electrode 11a shared by the silicon pillars. On the other hand, a power feed gate electrode 11b is provided on side surfaces of the dummy pillar 6. The power feed gate electrode 11b and the gate electrode 11a are connected to each other by burying a gap (space) between the dummy pillar 6 and the closest silicon pillar ($5A_3$ in FIG. 1).

The metal contact plug 41 is connected, at its above-mentioned protruding portion, to the power feed gate electrode 11b provided on the side surface of the second dummy pillar 6B. The thickness in plan view (the thickness in the X-direction in FIG. 2) of each of the gate electrodes 11a and the power feed gate electrode 11b is set to 20 nm. Hereinbelow, the gate electrodes 11a and the power feed gate electrode 11b will be collectively referred to as gate electrodes 11.

Since the thickness of each gate electrode 11 is set to 20 nm, the interval between the silicon pillars and the interval between the silicon pillar and the dummy pillar, each set to 30 nm as described above, are each twice or less the thickness of each gate electrode 11. Therefore, the gate electrodes 11 each having the thickness of 20 nm, which are provided on the side surfaces of the first to fifth silicon pillars $5A_1$ to $5A_5$ and the dummy pillar 6, are in contact with each other in the portions where the interval between the pillars is set to 30 nm, i.e. twice or less the thickness of each gate electrode 11, so that the gate electrodes 11 function as a single gate electrode. Consequently, a gate voltage supplied from the power feed gate electrode 11b of the dummy pillar 6 is supplied through the gate electrode 11a of the third silicon pillar $5A_3$ to the gate electrodes 11a of the first silicon pillar $5A_1$, the second silicon pillar $5A_2$, the fourth silicon pillar $5A_4$, and the fifth silicon pillar $5A_5$.

In FIG. 1, the metal contact plug 31 is provided so as to be surrounded by the five unit transistors arranged in the ⊓-shape. As shown in FIG. 1, the metal contact plug 31 has a circular shape in plan view having its center at an intersection between a center line in the Y-direction passing through the centers of the first and fifth unit transistors $50A_1$ and $50A_5$ and a center line in the X-direction passing through the center of the third unit transistor $50A_3$. In the first embodiment, the diameter of the metal contact plug 31 is set to 40 nm. As described before, the width of each silicon pillar in each of the XY-directions is set to 50 nm and the interval between the silicon pillars is set to 30 nm. Therefore, the closest interval between the outer periphery of the metal contact plug 31 and each of the first silicon pillar $5A_1$, the third silicon pillar $5A_3$, and the fifth silicon pillar $5A_5$ is 35 nm, which is the minimum interval.

On the other hand, the second silicon pillar $5A_2$ and the fourth silicon pillar $5A_4$ are each located in a direction inclined by 45 degrees from the X-direction with respect to the metal contact plug 31. Therefore, one corner of the rectangular shape of each of the second silicon pillar $5A_2$ and the fourth silicon pillar $5A_4$ is closest to the outer periphery of the metal contact plug 31. In this case, the closest interval therebetween is 57 nm.

In the first embodiment, the interval between the outer periphery of the metal contact plug 31 and each of the first silicon pillar $5A_1$, the third silicon pillar $5A_3$, and the fifth silicon pillar $5A_5$, the center of which is located on the same center line in the X- or Y-direction as the center of the metal contact plug 31, is 35 nm, which is the minimum interval. On the other hand, the interval between the outer periphery of the metal contact plug 31 and each of the second silicon pillar $5A_2$ and the fourth silicon pillar $5A_4$, each located in the direction inclined by 45 degrees from the center line in the X-direction with respect to the metal contact plug 31, is 57 nm, which is the maximum interval. In this case, since the maximum interval (57 nm) is twice or less the minimum interval (35 nm), it is possible to avoid the prior art problem that the intervals between the metal contact plug 31 and the respective silicon pillars become non-uniform so that parasitic resistances of the lower diffusion layer from the metal contact plug 31 to the respective silicon pillars differ from each other, resulting in unstable characteristics of the entire semiconductor device. If each silicon pillar has a circular shape in plan view having a diameter of 50 nm, the maximum interval becomes 67 nm. Accordingly, even in this case, the maximum interval (67 nm) is twice or less the minimum interval (35 nm) so that it is possible to avoid the above-mentioned problem.

A metal interconnection 34 is disposed on the metal contact plug 31. The metal interconnection 34 is connected to the pillar lower diffusion layer 9, forming the unit transistors, through the metal contact plug 31, thereby serving as power feed wiring to the pillar lower diffusion layer 9.

While a description will be given later with reference to FIG. 16, a pattern 40 shown in FIG. 1 represents a region, which is removed for providing the silicon plugs 19, of a mask film 13 (not illustrated), wherein the inside of the pattern 40 is an opening 14 (not illustrated).

Figure 2:
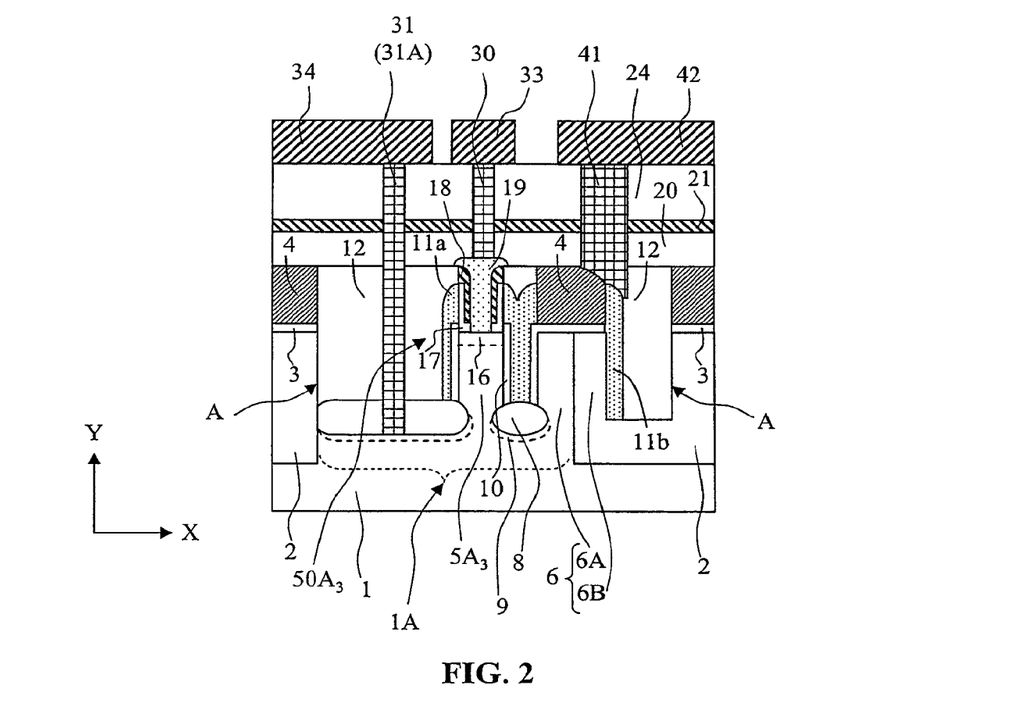
FIG. 2 is a cross-sectional view taken along line X1-X1' of FIG. 1.
Figure 3:
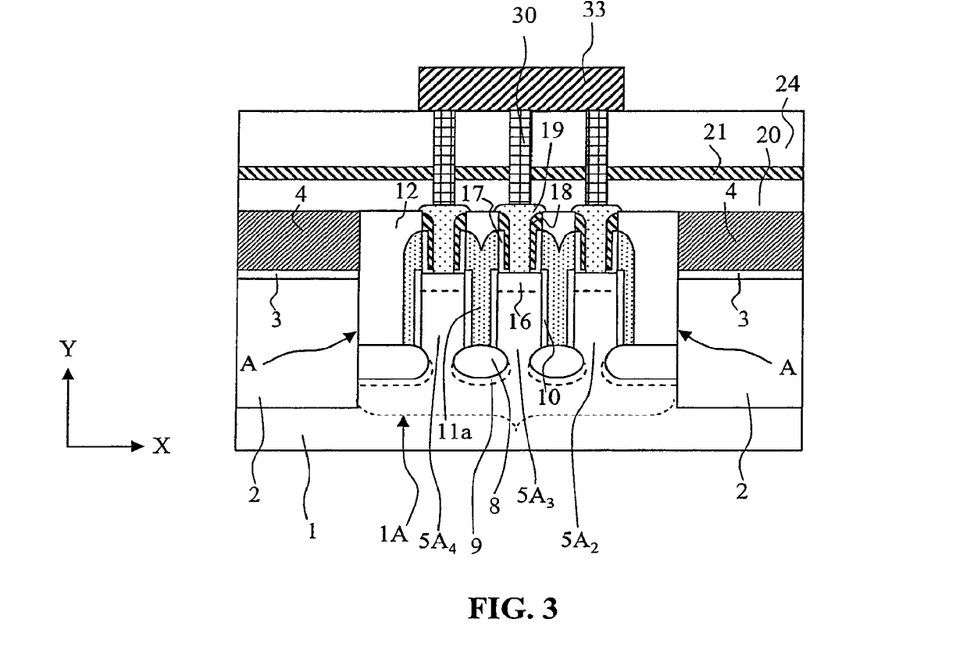
FIG. 3 is a cross-sectional view taken along line Y1-Y1' of FIG. 1.

Next, referring to FIGS. 2 and 3, details of the structure of the individual unit transistors 50 will be further described. The STI (shallow trench isolation; element isolation region) 2 is provided on the silicon substrate 1. The five silicon pillars 5, i.e. the first to fifth silicon pillars $5A_1$ to $5A_5$, each being a semiconductor base pillar, are provided to stand upright in the active region 1A which is the silicon substrate 1 surrounded by the STI 2.

Each silicon pillar 5 is a columnar semiconductor forming a channel of the corresponding unit transistor 50. Therefore, each unit transistor is a vertical transistor. The five silicon pillars are arranged so as to have the same height in the active region 1A defined by the STI 2. The thickness of each silicon pillar (the size of a cross section taken along a plane parallel to a surface of the silicon substrate 1) is set so as to allow full depletion of the channel.

Each unit transistor has impurity diffusion layers at upper and lower end portions of the silicon pillar 5. The pillar upper diffusion layer 16 located at the upper end portion of the silicon pillar forms one of a source and a drain while the pillar lower diffusion layer 9 located at the lower end portion of the silicon pillar forms the other of the source and the drain. A middle portion, between the pillar upper diffusion layer 16 and the pillar lower diffusion layer 9, of the silicon pillar forms the channel.

The dummy pillar 6 is disposed adjacent, in the X-direction, to the third silicon pillar $5A_3$ located at the center of the five silicon pillars in the Y-direction. The silicon pillars 5 and the first dummy pillar 6A are formed by etching a surface of the silicon substrate 1 while the second dummy pillar 6B is formed by etching a surface of the STI 2. The first dummy pillar 6A is a columnar semiconductor protruding from the etched surface of the silicon substrate 1 while the second dummy pillar 6B is a columnar semiconductor protruding from the etched surface of the STI 2. The dummy pillar 6 serves as a protruding layer that increases the height of the power feed gate electrode 11b to reduce the distance between the power feed gate electrode 11b and a gate-lift interconnection 42 disposed above the power feed gate electrode 11b. The interval between the adjacent silicon pillars 5 and the interval between the dummy pillar 6 and the silicon pillar $5A_3$ are each set to twice or less the thickness of each gate electrode 11. Herein, this interval is set to 30 nm. The thickness of each gate electrode 11 in plan view is set to 20 nm.

An insulating film 8 is provided on the etched surface of the active region 1A (silicon substrate 1) located around the silicon pillars 5 and the first dummy pillar 6A. The insulating film 8 covers the etched surface around the silicon pillars 5 and the first dummy pillar 6A and reaches the STI 2. The pillar lower diffusion layer 9 is disposed under the insulating film 8 so as to overlap the insulating film 8 so that the pillar lower diffusion layer 9 is electrically insulated from the gate electrodes 11 by the insulating film 8. The pillar lower diffusion layer 9 electrically connects the five silicon pillars to each other and forms a lower diffusion layer common to the five unit transistors, i.e. the first to fifth unit transistors $50A_1$ to $50A_5$. The STI 2 is provided deeper than the pillar lower diffusion layer 9 so that pillar lower diffusion layers 9 in active regions 1A adjacent to each other across the STI 2 do not conduct each other.

The gate insulating films 10 are disposed on the side surfaces of the silicon pillars 5 and the first dummy pillar 6A. Further, the gate electrodes 11a and the power feed gate electrode 11b each having the thickness (the thickness in the X-direction in FIG. 2) of 20 nm are respectively disposed on the side surfaces of the silicon pillars 5 and the first dummy pillar 6A with the gate insulating films 10 interposed therebetween. On the other hand, only the power feed gate electrode 11b is disposed on the side surfaces of the second dummy pillar 6B. Although not illustrated herein, gate electrodes 11 are also provided on portions of inner wall surfaces of the STI 2 and on portions of inner wall surfaces of an insulating film 3 and a mask film 4 stacked on the upper surface of the STI 2. The gate insulating films 10 cover the outer peripheral surfaces of the silicon pillars 5 and are connected to the insulating film 8. The silicon pillars 5 (channels), the pillar upper diffusion layers 16, and the pillar lower diffusion layer 9 disposed under the insulating film 8 are electrically insulated from the gate electrodes 11 by the gate insulating films 10 and the insulating film 8.

As shown in FIG. 2, for example, the unit transistor $50A_3$ is formed by the lower diffusion layer 9, the upper diffusion layer 16, the gate insulating film 10, and the gate electrode 11a.

Insulating films 3 are disposed on the upper surfaces of the STI 2 and the dummy pillar 6. Mask films 4 are disposed over the upper surfaces of the STI 2 and the dummy pillar 6 so as to cover the insulating films 3 and, further, a first interlayer insulating film 12 is provided to cover the gate electrodes 11 and the insulating film 8. The first interlayer insulating film 12 is provided by burying a recess in the pillar groove forming region A. That is, the first interlayer insulating film 12 is provided in a region surrounded by the inner wall surfaces of the STI 2, the insulating film 3 stacked thereon, and the mask film 4 stacked thereon. A second interlayer insulating film 20 is provided on upper surfaces of the mask films 4 and the first interlayer insulating film 12. A stopper film 21 is provided to cover the second interlayer insulating film 20 and, further, a third interlayer insulating film 24 is provided to cover the stopper film 21.

The gate-lift interconnection 42 is disposed on an upper surface of the third interlayer insulating film 24. The gate-lift interconnection 42 is connected to the power feed gate electrode 11b through the metal contact plug 41 passing through the third interlayer insulating film 24, the stopper film 21, the second interlayer insulating film 20, and the first interlayer insulating film 12.

Jointly with the dummy pillar 6, the mask film 4 disposed over the dummy pillar 6 serves as a protruding layer that increases the height of the power feed gate electrode 11b to reduce the distance between the power feed gate electrode 11b and the gate-lift interconnection 42.

Metal interconnections 33 and 34 are disposed on the upper surface of the third interlayer insulating film 24.

The metal interconnection 33 is connected to the pillar upper diffusion layers 16 of the silicon pillars through the metal contact plugs 30 passing through the third interlayer insulating film 24, the stopper film 21, the second interlayer insulating film 20, and the silicon plugs 19 surrounded by the first interlayer insulating film 12 and the gate electrodes 11a. The silicon plugs 19 are formed by injecting (diffusing) impurities such as arsenic into silicon. Jointly with the pillar upper diffusion layer 16, each silicon plug 19 forms one of the source and the drain of the unit transistor 50. A sidewall film 18 and an insulating film 17 are disposed on side surfaces of each silicon plug 19. Consequently, the silicon plugs 19 are each electrically insulated from the gate electrode 11a by the sidewall film 18 and the insulating film 17.

The metal interconnection 34 is connected to the pillar lower diffusion layer 9 through the metal contact plug (conductive plug) 31 passing through the third interlayer insulating film 24, the stopper film 21, the second interlayer insulating film 20, the first interlayer insulating film 12, and the insulating film 8.

As described above, the semiconductor device 100 according to the first embodiment has the first and second unit transistors ($50A_1$, $50A_2$) which are arranged at an interval therebetween so that their centers are located on the same line in the first direction (X-direction), the second, third, and fourth unit transistors ($50A_2$, $50A_3$, $50A_4$) which are arranged at an interval therebetween so that their centers are located on the same line in the second direction (Y-direction) perpendicular to the first direction, and the fourth and fifth unit transistor ($50A_4$, $50A_5$) which are arranged at an interval therebetween so that their centers are located on the same line in the first direction, the first to fifth unit transistors standing upright and sharing the pillar lower diffusion layer 9 in the single active region 1A, and further has the metal contact plug 31 electrically connected to the pillar lower diffusion layer 9, wherein the metal contact plug 31 has a circular shape in plan view having its center at the intersection between the center line in the second direction passing through the centers of the first and fifth unit transistors $50A_1$ and $50A_5$ and the center line in the first direction passing through the center of the third unit transistor $50A_3$.

With this configuration, as shown in FIG. 1, in the semiconductor device 100, the closest interval W1 between the outer periphery of the metal contact plug 31 and the second silicon pillar $5A_2$ can be set to twice or less the closest interval W2 between the outer periphery of the metal contact plug 31 and the third silicon pillar $5A_3$, i.e. the uniform arrangement can be achieved. In this case, W1 represents the maximum interval while W2 represents the minimum interval. That is, the maximum interval can be set to twice or less the minimum interval.

Consequently, it is possible to avoid the prior art problem that the intervals between the metal contact plug 31 and the respective silicon pillars become non-uniform so that parasitic resistances of the lower diffusion layer 9 from the metal contact plug 31 to the respective silicon pillars differ from each other, resulting in unstable characteristics of the entire semiconductor device 100.

Next, a semiconductor device 100a according to a second embodiment of this invention will be described with reference to FIG. 4.

In the second embodiment, unit transistors are additionally arranged at open ends of both side portions of then ⊓-shape in the first embodiment.

In the second embodiment, the same reference symbols are assigned to components having the same functions as in the first embodiment, thereby mainly describing those portions which are different from the first embodiment.

Figure 4:
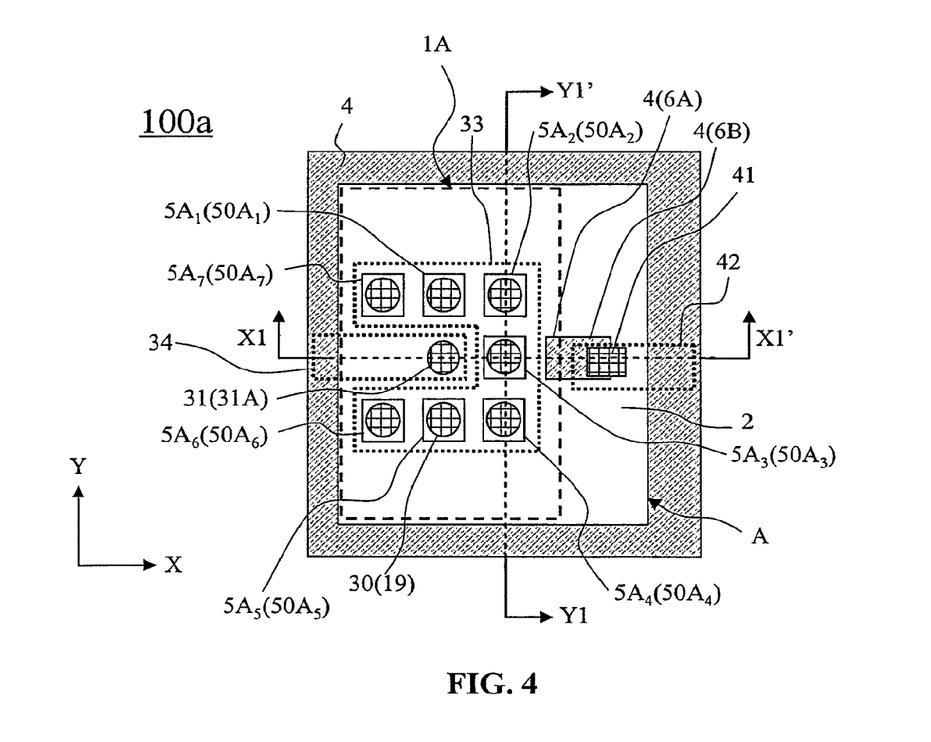
FIG. 4 is an exemplary diagram (plan view) showing the structure of a semiconductor device 100a according to a second embodiment of this invention.

As shown in FIG. 4, the semiconductor device 100a according to the second embodiment is configured such that a sixth unit transistor $50A_6$ and a seventh unit transistor $50A_7$, which are new unit transistors, are respectively arranged at open ends of both side portions of then ⊓-shape in the first embodiment. That is, three unit transistors, i.e. the seventh unit transistor $50A_7$, a first unit transistor $50A_1$, and a second unit transistor $50A_2$, are arranged at an interval therebetween so that their centers are located on the same line in the X-direction. Further, three unit transistors, i.e. the second unit transistor $50A_2$, a third unit transistor $50A_3$, and a fourth unit transistor $50A_4$, are arranged at an interval therebetween so that their centers are located on the same line in the Y-direction. Further, three unit transistors, i.e. the fourth unit transistor $50A_4$, a fifth unit transistor $50A_5$, and the sixth unit transistor $50A_6$, are arranged at an interval therebetween so that their centers are located on the same line in the X-direction. The seventh, first, and second unit transistors ($50A_7$, $50A_1$, $50A_2$) and the sixth, fifth, and fourth unit transistors ($50A_6$, $50A_5$, $50A_4$) are arranged at positions which are axisymmetric with respect to a line extending in the X-direction through the center of the third unit transistor $50A_3$. Consequently, the seven unit transistors are arranged in ⊓-shape. Each unit transistor is a vertical transistor. As in the first embodiment, the seven unit transistors share a pillar lower diffusion layer and are connected in parallel to each other by a metal interconnection 33, thereby forming a single parallel transistor.

As in the first embodiment, a metal contact plug 31 of a circular shape in plan view is disposed so as to be surrounded by seven silicon pillars 5 at a central portion of a region sandwiched between the first silicon pillar $5A_1$ and the fifth silicon pillar $5A_5$ in then ⊓-shape. With this configuration, the maximum interval given by the closest interval between the metal contact plug 31 and each of the second silicon pillar $5A_2$, the fourth silicon pillar $5A_4$, the sixth silicon pillar $5A_6$, and the seventh silicon pillar $5A_7$ in plan view can be set to twice or less the minimum interval given by the closest interval between the metal contact plug 31 and each of the first silicon pillar $5A_1$, the third silicon pillar $5A_3$, and the fifth silicon pillar $5A_5$ in plan view, i.e. the uniform arrangement can be achieved.

Consequently, the semiconductor device 100a according to the second embodiment can deal with a current greater than that in the first embodiment while avoiding unstable characteristics of the parallel transistor formed by the vertical transistors.

Next, a semiconductor device 100b according to a third embodiment of this invention will be described with reference to FIG. 5.

In the third embodiment, unit transistors are arranged in a shape in which, using the transistor arrangement of the first embodiment as a basic structure, a plurality of basic structures are combined in the Y-direction.

In the third embodiment, the same reference symbols are assigned to components having the same functions as in the first embodiment, thereby mainly describing those portions which are different from the first embodiment.

Figure 5:
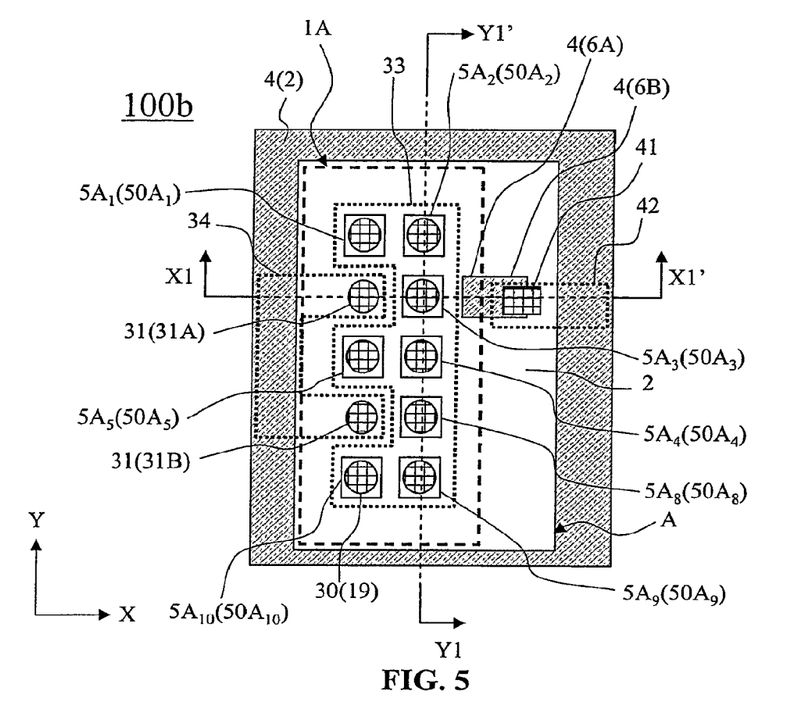
FIG. 5 is an exemplary diagram (plan view) showing the structure of a semiconductor device 100b according to a third embodiment of this invention.

As shown in FIG. 5, the semiconductor device 100b according to the third embodiment has an active region 1A surrounded by an STI 2, wherein eight silicon pillars 5 ($5A_1$ to $5A_5$ and $5A_8$ to $5A_{10}$) each having a rectangular shape in plan view are provided in the active region 1A. The eight silicon pillars 5 are arranged in a shape combining a plurality of ⊓-shapes in plan view, herein, in a "double ⊓-shape" combining two ⊓-shapes. More specifically, part ($5A_2$ to $5A_4$, $5A_8$, $5A_9$) of the eight silicon pillars 5 are arranged at regular intervals in the Y-direction and the first silicon pillar $5A_1$ is arranged on the left side of the second silicon pillar $5A_2$ at an interval therebetween in the X-direction which is the same as the interval between the adjacent silicon pillars 5 in the Y-direction. Like the first silicon pillar $5A_1$, the fifth silicon pillar $5A_5$ is arranged on the left side of the fourth silicon pillar $5A_4$ and the tenth silicon pillar $5A_{10}$ is arranged on the left side of the ninth silicon pillar $5A_9$.

In the double ⊓-shape defined by the eight silicon pillars 5, two metal contact plugs 31 (31A, 31B) each having a circular shape in plan view are respectively disposed at central portions of regions respectively sandwiched between the first silicon pillar $5A_1$ and the fifth silicon pillar $5A_5$ and between the fifth silicon pillar $5A_5$ and the tenth silicon pillar $5A_{10}$, so as to be respectively surrounded by the silicon pillars 5 arranged in ⊓-shapes. With this configuration, the maximum interval given by the closest interval between the metal contact plug 31 (31A, 31B) and each of the second silicon pillar $5A_2$, the fourth silicon pillar $5A_4$, and the ninth silicon pillar $5A_9$ in plan view can be set to twice or less the minimum interval given by the closest interval between the metal contact plug 31 (31A, 31B) and each of the first silicon pillar $5A_1$, the third silicon pillar $5A_3$, the fifth silicon pillar $5A_5$, the eighth silicon pillar $5A_8$, and the tenth silicon pillar $5A_{10}$ in plan view, i.e. the uniform arrangement can be achieved.

Consequently, the semiconductor device 100b according to the third embodiment can deal with a current greater than that in the first embodiment while avoiding unstable characteristics of the parallel transistor formed by the vertical transistors.

Next, a semiconductor device 100c according to a fourth embodiment of this invention will be described with reference to FIG. 6.

In the fourth embodiment, unit transistors are additionally arranged at open ends of side portions of the double ⊓-shape in the third embodiment.

In the fourth embodiment, the same reference symbols are assigned to components having the same functions as in the third embodiment, thereby mainly describing those portions which are different from the third embodiment.

Figure 6:
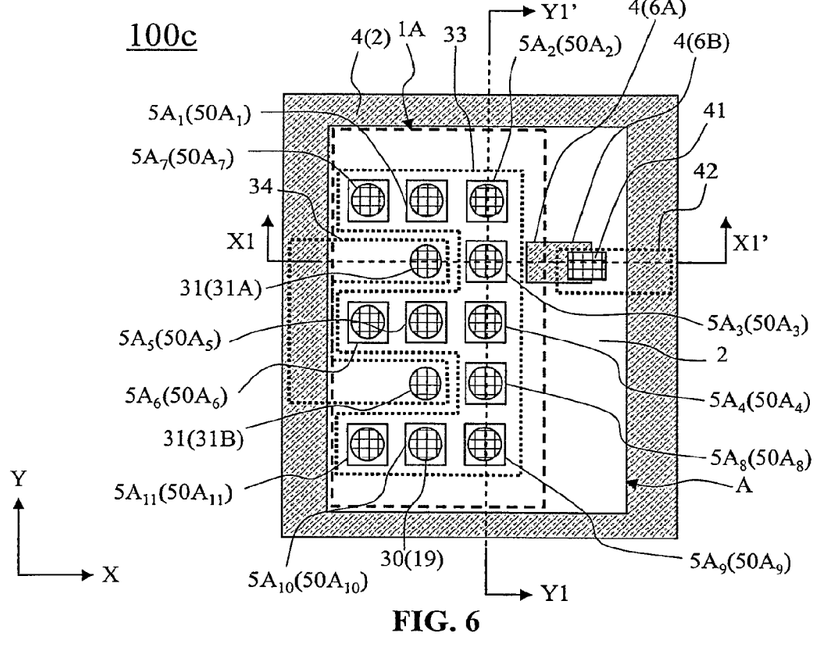
FIG. 6 is an exemplary diagram (plan view) showing the structure of a semiconductor device 100c according to a fourth embodiment of this invention.

As shown in FIG. 6, the semiconductor device 100c according to the fourth embodiment has an active region 1A surrounded by an STI 2, wherein eleven silicon pillars 5 ($5A_1$ to $5A_{11}$) each having a rectangular shape in plan view are provided in the active region 1A. The eleven silicon pillars 5 are arranged in a double ⊓-shape in plan view. More specifically, part ($5A_2$ to $5A_4$, $5A_8$, $5A_9$) of the eleven silicon pillars 5 are arranged at regular intervals in the Y-direction and, further, the first silicon pillar $5A_1$ and the seventh silicon pillar $5A_7$ are arranged so as to be aligned with the second silicon pillar $5A_2$ in the X-direction. Like the first silicon pillar $5A_1$ and the seventh silicon pillar $5A_7$, the fifth silicon pillar $5A_5$ and the sixth silicon pillar $5A_6$ are arranged so as to be aligned with the fourth silicon pillar $5A_4$ in the X-direction. Further, the tenth silicon pillar $5A_{10}$ and the eleventh silicon pillar $5A_{11}$ are arranged so as to be aligned with the ninth silicon pillar $5A_9$ in the X-direction. The interval between the silicon pillars aligned in the X-direction is the same as the interval between the silicon pillars aligned in the Y-direction.

In the double ⊓-shape defined by the eleven silicon pillars 5, two metal contact plugs 31 (31A, 31B) each having a circular shape in plan view are respectively disposed at central portions of regions respectively sandwiched between the first silicon pillar $5A_1$ and the fifth silicon pillar $5A_5$ and between the fifth silicon pillar $5A_5$ and the tenth silicon pillar $5A_{10}$. With this configuration, the maximum interval given by the closest interval between the metal contact plug 31 (31A, 31B) and each of the second silicon pillar $5A_2$, the fourth silicon pillar $5A_4$, the sixth silicon pillar $5A_6$, the seventh silicon pillar $5A_7$, the ninth silicon pillar $5A_9$, and the eleventh silicon pillar $5A_{11}$ in plan view can be set to twice or less the minimum interval given by the closest interval between the metal contact plug 31 (31A, 31B) and each of the first silicon pillar $5A_1$, the third silicon pillar $5A_3$, the fifth silicon pillar $5A_5$, the eighth silicon pillar $5A_8$, and the tenth silicon pillar $5A_{10}$ in plan view, i.e. the uniform arrangement can be achieved.

Consequently, the semiconductor device 100c according to the fourth embodiment can deal with a current greater than that in the third embodiment while avoiding unstable characteristics of the parallel transistor formed by the vertical transistors.

Next, a semiconductor device 100d according to a fifth embodiment of this invention will be described with reference to FIG. 7.

The fifth embodiment is configured such that, as different from the first to fourth embodiments, silicon pillars are uniformly arranged near metal contact plugs in a structure in which the silicon pillars are aligned in one row.

In the fifth embodiment, the same reference symbols are assigned to components having the same functions as in the first to fourth embodiments, thereby mainly describing those portions which are different from the first embodiment.

Figure 7:
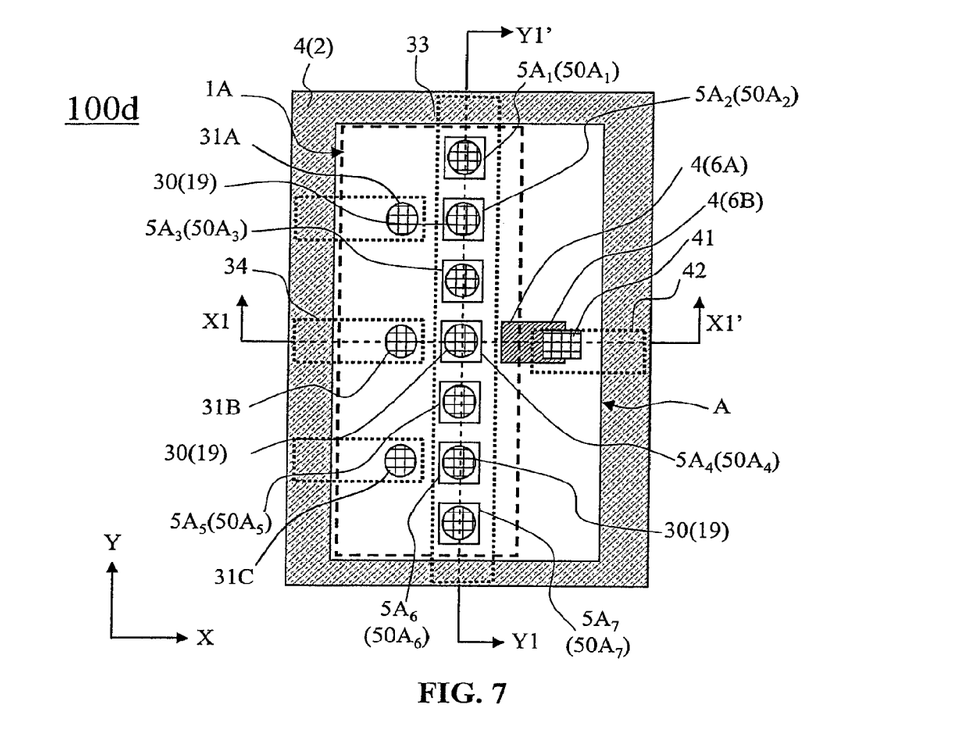
FIG. 7 is an exemplary diagram (plan view) showing the structure of a semiconductor device 100d according to a fifth embodiment of this invention.

As shown in FIG. 7, the semiconductor device 100d according to the fifth embodiment has seven silicon pillars 5 ($5A_1$ to $5A_7$) arranged at regular intervals in the Y-direction and three metal contact plugs 31 (31A, 31B, 31C) arranged at regular intervals in the Y-direction.

More specifically, the metal contact plug 31B is disposed so that its center is aligned in the X-direction with the center of the fourth silicon pillar $5A_4$ located in the middle of the seven silicon pillars 5 arranged in the Y-direction in a single active region 1A, and the metal contact plugs 31A and 31C are further disposed so that their centers are respectively aligned in the X-direction with the centers of the second silicon pillar $5A_2$ and the sixth silicon pillar $5A_6$. The interval between each silicon pillar 5 and the corresponding metal contact plug 31 is set to twice or less the minimum interval. In this case, the interval between each metal contact plug 31 and the corresponding silicon pillar 5 facing it in the X-direction is the minimum interval.

In this manner, the silicon pillars 5 do not necessarily surround the contact plug 31 in ⊓-shape and it is satisfactory if the silicon pillars 5 are uniformly arranged with respect to the metal contact plug 31, i.e. the maximum interval between the metal contact plug 31 and the silicon pillar 5 is twice or less the minimum interval between the metal contact plug 31 and the silicon pillar 5.

Next, a method of manufacturing the semiconductor device 100 according to the first embodiment will be described in detail with reference to FIGS. 8 to 20.

Since methods of manufacturing the semiconductor devices 100a to 100d according to the second to fifth embodiments are the same as the method of manufacturing the semiconductor device 100 according to the first embodiment, explanation thereof is omitted.

Figure 8:
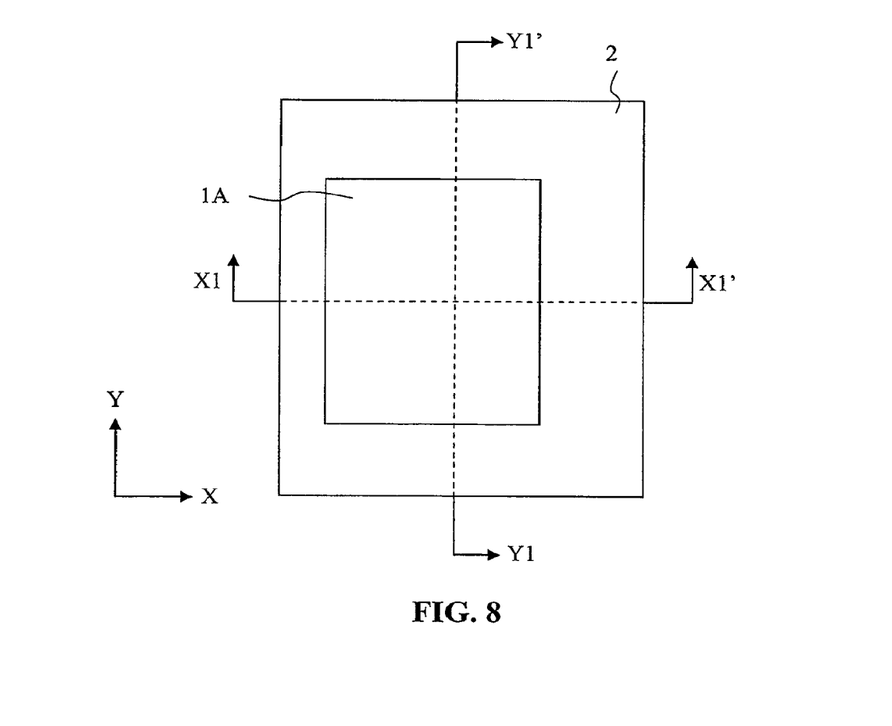
FIG. 8 is a diagram (plan view) for explaining a method of manufacturing the semiconductor device 100 according to the first embodiment.
Figure 9:
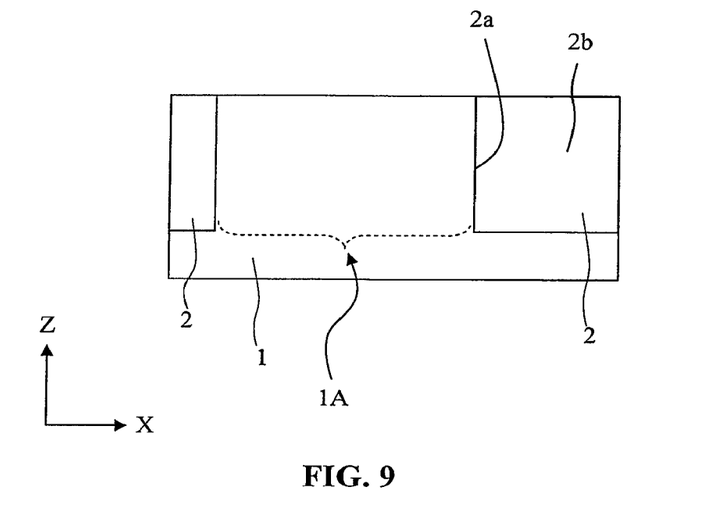
FIG. 9 is a cross-sectional view taken along line X1-X1' of FIG. 8.

First, as shown in FIGS. 8 and 9, a trench 2a is formed in a silicon substrate 1 using photolithography and dry etching. The depth of the trench 2a is set to, for example, 250 nm. Then, an insulating film 2b in the form of a silicon nitride film or a silicon oxide film is deposited over the entire surface of the silicon substrate 1 by CVD (chemical vapor deposition), thereby burying the trench 2a. Thereafter, the unnecessary insulating film 2b formed on the silicon substrate 1 is removed by CMP (chemical mechanical polishing) so that the insulating film 2b remains only in the trench 2a, thereby forming an STI 2 which will serve as an element isolation region. In this manner, an active region 1A surrounded by the STI 2 is formed.

Figure 10:
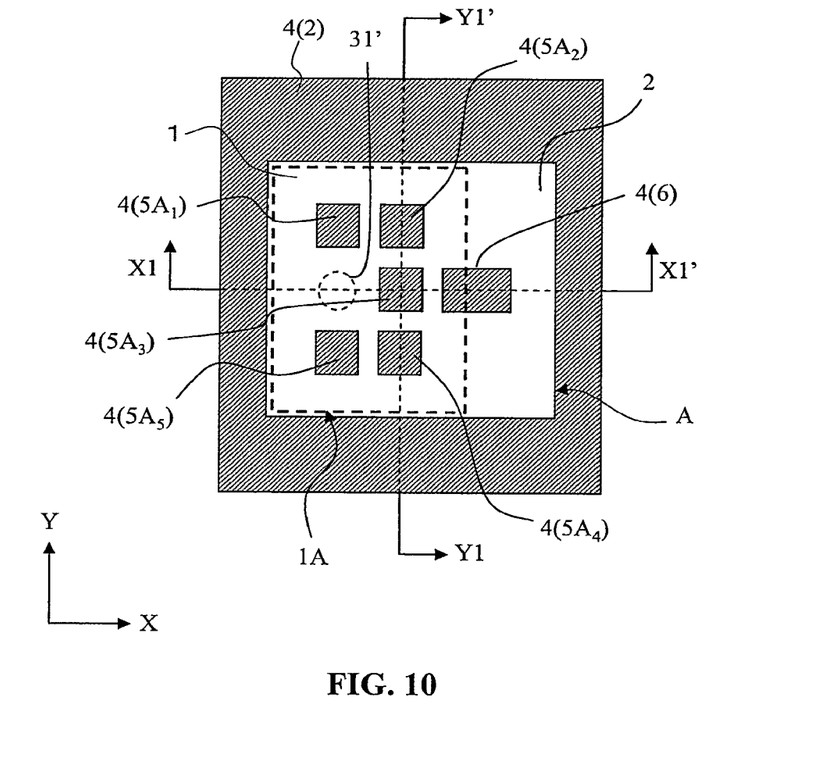
FIG. 10 is a diagram (plan view) for explaining the method of manufacturing the semiconductor device 100 according to the first embodiment.
Figure 11:
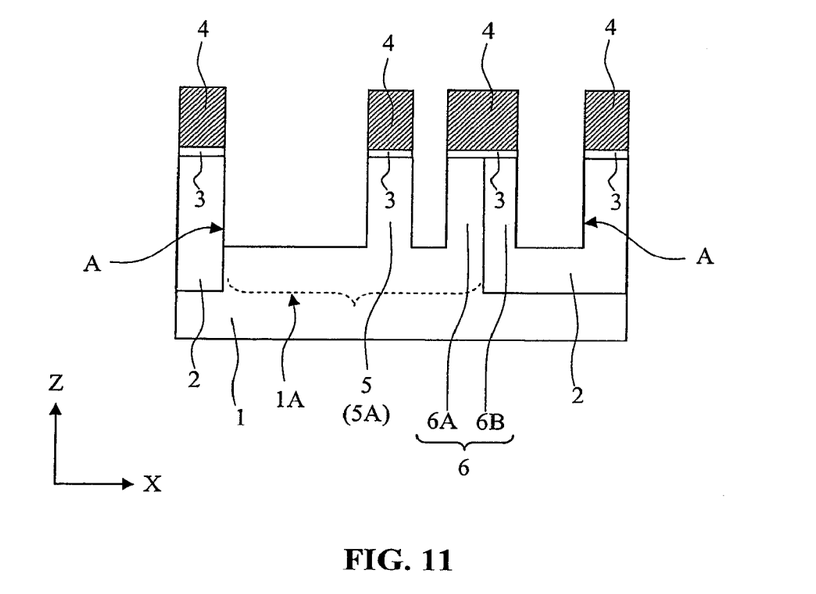
FIG. 11 is a cross-sectional view taken along line X1-X1' of FIG. 10.
Figure 12:
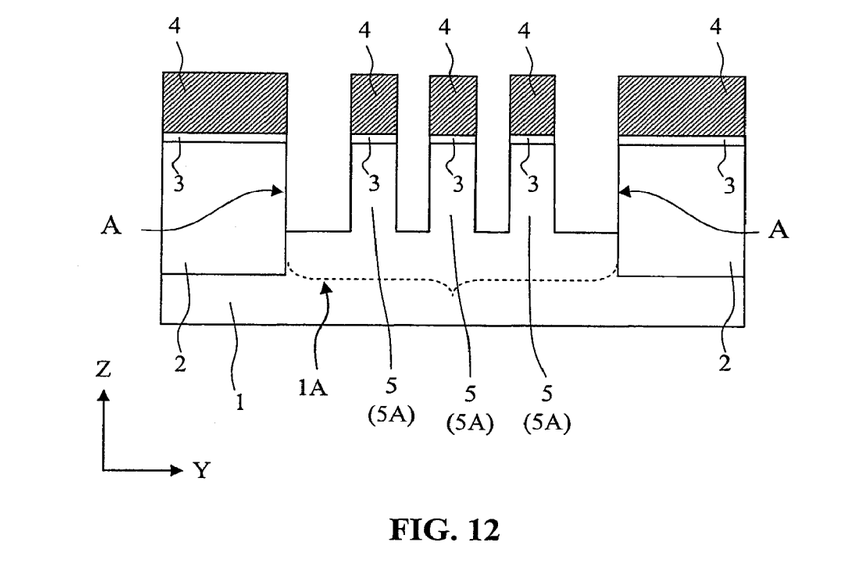
FIG. 12 is a cross-sectional view taken along line Y1-Y1' of FIG. 10.

Then, as shown in FIGS. 10 to 12, an insulating film 3 in the form of a silicon oxide film is deposited to a thickness of 2 nm on the silicon substrate 1 and the STI 2 by CVD and then a mask film 4 in the form of a silicon nitride film is deposited to a thickness of 120 nm on the insulating film 3 by CVD. Then, a non-illustrated photoresist mask having a pattern which will be a pillar groove forming region A defined by moving in parallel the position of one side surface of the active region 1A to the STI 2 side is formed by photolithography. The photoresist mask may be a hard mask such as an amorphous carbon film. In this event, patterns corresponding to the arrangement of five silicon pillars $5A_1$ to $5A_5$ arranged in ⊓-shape and a pattern corresponding to the arrangement of a dummy pillar 6 lying over the boundary between the active region 1A and the STI 2 are simultaneously formed. Each of the patterns corresponding to the silicon pillars $5A_1$ to $5A_5$ is formed to have a rectangular shape having a width of 50 nm in each of the XY-directions. Each pattern is not limited to the rectangular shape and may have a circular shape with a diameter of 50 nm. Further, the interval between the silicon pillars 5 is set to twice or less the thickness of each of gate electrodes which will be formed later. Specifically, in FIG. 10, the interval between the first silicon pillar $5A_1$ and the second silicon pillar $5A_2$ which are arranged so that their centers are located on the same line in the X-direction is set to 30 nm. Likewise, the interval between the fifth silicon pillar $5A_5$ and the fourth silicon pillar $5A_4$ which are arranged so that their centers are located on the same line in the X-direction is also set to 30 nm. Further, the intervals between the second silicon pillar $5A_2$ and the third silicon pillar $5A_3$ and between the third silicon pillar $5A_3$ and the fourth silicon pillar $5A_4$, whose centers are located on the same line in the Y-direction, are also each set to 30 nm.

The center of the inside of the ⊓-shape is a position 31' where a metal contact plug 31 will be disposed later and, in other words, the silicon pillars 5 are uniformly arranged around the position 31' (in FIG. 10, the silicon pillars 5 are arranged in the ⊓-shape so as to surround the position 31').

Likewise, the dummy pillar 6 is arranged adjacent to the third silicon pillar $5A_3$ in the X-direction at an interval twice or less the thickness of each gate electrode. Herein, the interval between the third silicon pillar $5A_3$ and the dummy pillar 6 is also set to 30 nm. The thickness of each silicon pillar 5 (the size of a cross section taken along a plane parallel to the silicon substrate 1), which forms a channel, is set so as to allow full depletion of the channel. The width, in the Y-direction, of the dummy pillar 6 for lifting the gate electrode is set equal to the width of the silicon pillar 5 in the Y-direction while the width of the dummy pillar 6 in the X-direction may be different from that of the silicon pillar 5.

Then, by anisotropic dry etching using the photoresist mask, the patterns are transferred to the mask film 4 and the insulating film 3. As a result, an upper surface of the silicon substrate 1 and an upper surface of the STI 2 are exposed in a patterned opening portion (pillar groove forming region A). Thereafter, the photoresist mask is removed.

Then, using the patterned mask films 4 as a mask, the exposed silicon substrate 1 and STI 2 are dug down to a depth of 150 nm by anisotropic dry etching, thereby forming the five silicon pillars 5 ($5A_1$ to $5A_5$), which will serve as channels of unit transistors, and the dummy pillar 6 for connecting the power feed gate electrode to an upper interconnection. The pillars are formed so as to protrude upward from the dug-down upper surfaces of the silicon substrate 1 and the STI 2. The silicon pillars 5 are each formed into the rectangular shape having the width of 50 nm in each of the XY-directions. As shown in FIG. 11, the dummy pillar 6 is formed as a composite pillar in which one side surface of a first dummy pillar 6A standing on the active region 1A side and one side surface of a second dummy pillar 6B standing on the STI 2 side are in contact with each other so as to be integrated together.

Figure 13:
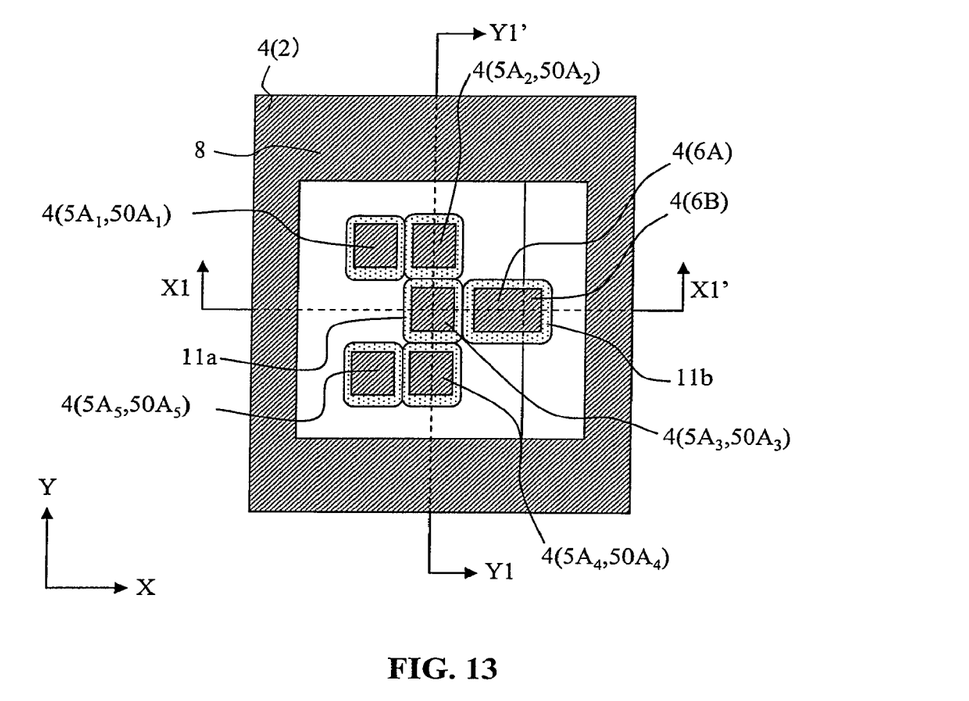
FIG. 13 is a diagram (plan view) for explaining the method of manufacturing the semiconductor device 100 according to the first embodiment.
Figure 14:
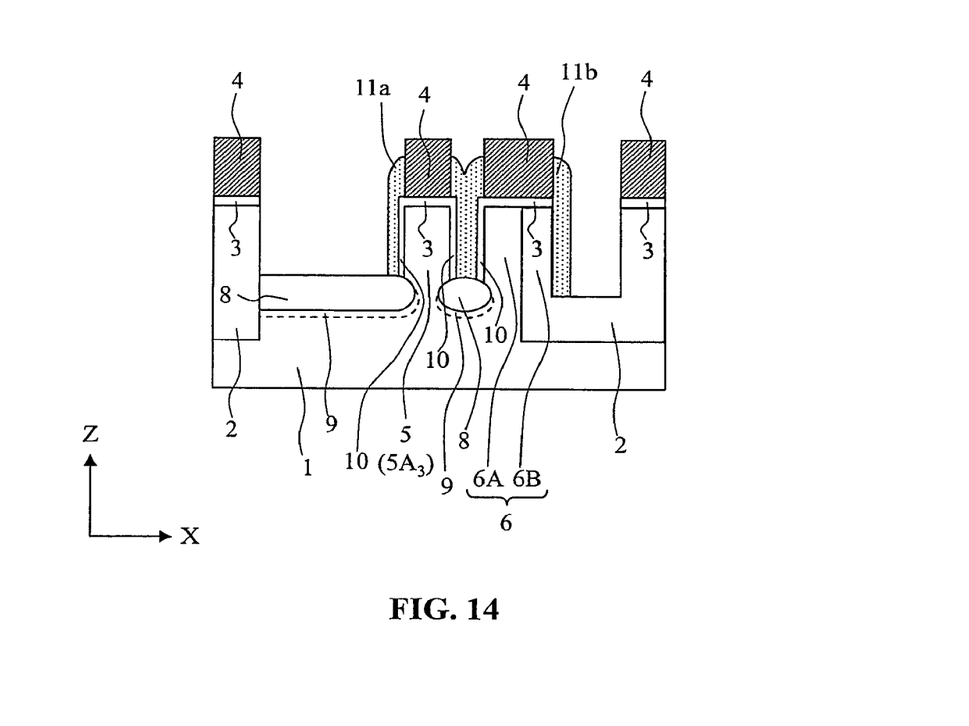
FIG. 14 is a cross-sectional view taken along line X1-X1' of FIG. 13.
Figure 15:
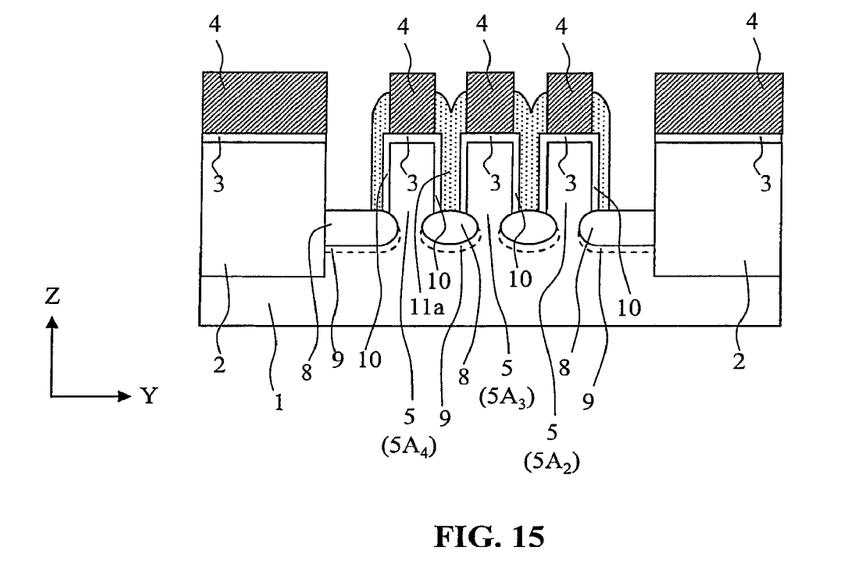
FIG. 15 is a cross-sectional view taken along line Y1-Y1' of FIG. 13.

Then, as shown in FIGS. 13 to 15, side surfaces of the silicon pillars 5 and the dummy pillar 6 are oxidized to a thickness of 5 nm by thermal oxidation (not illustrated) and, then, after depositing a silicon nitride film to a thickness of 20 nm by CVD, the entire surface is etched back to form sidewall films on the side surfaces of the silicon pillars 5, the dummy pillar 6, the insulating films 3, and the mask films 4. Then, an insulating film 8 is formed to a thickness of 30 nm by thermal oxidation at a portion, around the pillars, of the active region 1A, where the dug-down upper surface of the silicon substrate 1 is exposed. In this event, the side surfaces of the silicon pillars 5 and the dummy pillar 6 are not oxidized because the silicon nitride films are coated thereon.

Then, a pillar lower diffusion layer 9 is formed under the insulating film 8 by ion implantation. Herein, the pillar lower diffusion layer 9 is shared by the five silicon pillars 5 ($5A_1$ to $5A_5$). As impurities for the ion implantation, it is possible to use, for example, arsenic in the case of an n-type transistor. Then, the sidewall films and the thermal oxide films formed on the side surfaces of the silicon pillars 5 and the dummy pillar 6 are removed by dry etching or wet etching.

Then, gate insulating films 10 each in the form of a silicon oxide film having a thickness of 3 nm are formed on the side surfaces of the silicon pillars 5 and the first dummy pillar 6A by thermal oxidation. Then, a polysilicon film (polycrystalline silicon film) having a thickness of 20 nm, which will be gate electrodes, is deposited over the entire surface by CVD and then the entire surface is etched back, thereby forming gate electrodes 11a on the side surfaces of the silicon pillars 5 and a power feed gate electrode 11b on the side surfaces of the dummy pillar 6. When the gate electrodes 11 are formed on the side surfaces of the silicon pillars 5 and the dummy pillar 6, gate electrodes 11 (not illustrated) are also formed on the side surfaces of the STI 2. As shown in FIGS. 14 and 15, since, as described before, the interval between the adjacent silicon pillars 5 and the interval between the third silicon pillar $5A_3$ and the dummy pillar 6 are each set to 30 nm, i.e. twice or less the thickness of each gate electrode 11, gaps between the adjacent silicon pillars 5 and a gap between the third silicon pillar $5A_3$ and the dummy pillar 6 are completely buried by the gate electrodes 11a and the power feed gate electrode 11b. Consequently, the gate electrodes 11a on the side surfaces of the first to fifth silicon pillars $5A_1$ to $5A_5$ are integrally connected to each other and, further, the power feed gate electrode 11b on the side surfaces of the dummy pillar 6 is integrally connected to the gate electrode 11a on the side surfaces of the third silicon pillar $5A_3$.

Figure 16:
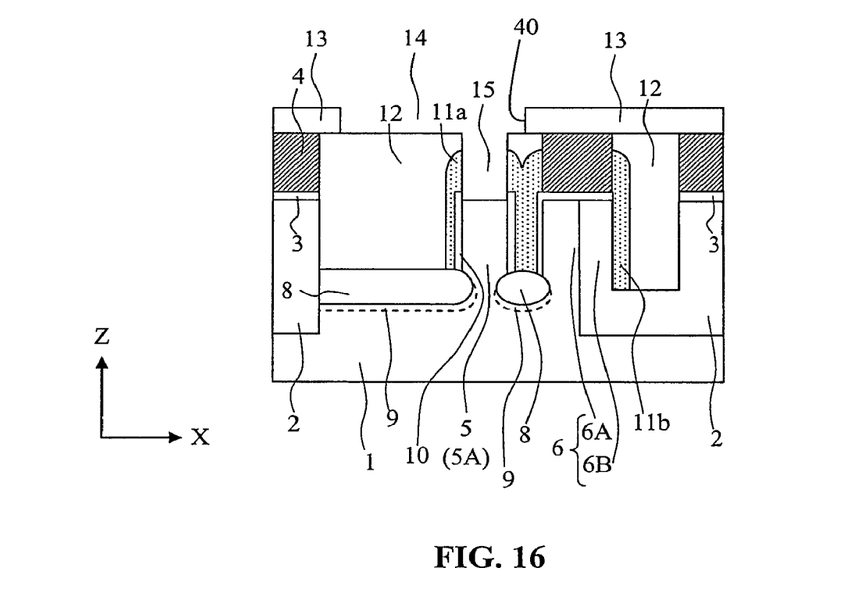
FIG. 16 is a diagram (cross-sectional view) for explaining the method of manufacturing the semiconductor device 100 according to the first embodiment.

Then, as shown in FIG. 16, a first interlayer insulating film 12 in the form of a silicon oxide film is deposited by CVD so as to bury the silicon pillars 5 and the dummy pillar 6. Then, the first interlayer insulating film 12 is flattened by CMP so as to expose the mask films 4. Subsequently, a mask film 13 in the form of a silicon oxide film is deposited to a thickness of 50 nm by CVD.

Then, the mask film 13 is partially removed by photolithography and etching. A pattern 40, to be removed, of the mask film 13 is, as shown in FIG. 1, only a region where the silicon pillars 5 are arranged. At an opening 14 with the mask film 13 removed, the mask films 4 above the silicon pillars 5 are exposed. Then, the exposed mask films 4 are selectively removed by wet etching and further the insulating films 3 are removed, thereby forming openings 15 above the silicon pillars 5. Upper surfaces of the silicon pillars 5 are exposed at the bottom of the openings 15 and the gate electrodes 11a are partially exposed at side surfaces of the openings 15.

Figure 17:
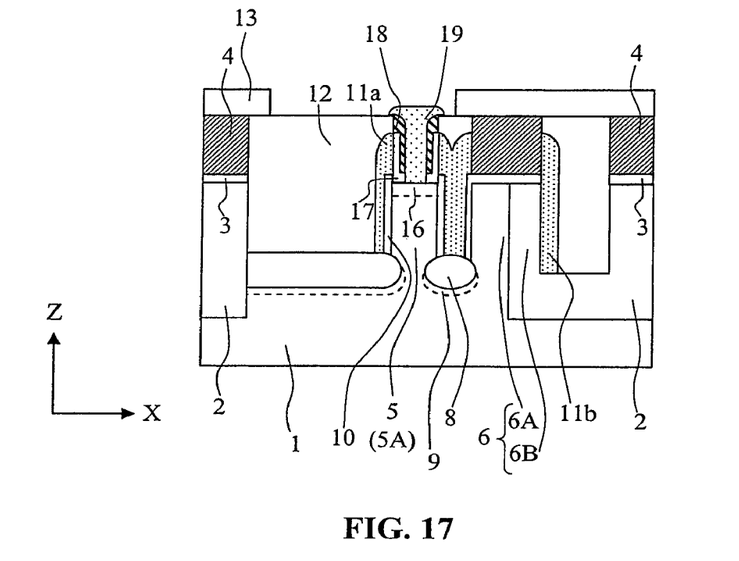
FIG. 17 is a diagram (cross-sectional view) for explaining the method of manufacturing the semiconductor device 100 according to the first embodiment.

Then, as shown in FIG. 17, an insulating film 17 in the form of a silicon oxide film is formed on inner walls of each opening 15 by thermal oxidation. Then, impurities (e.g. phosphorus or arsenic in the case of an n-type transistor) are implanted into upper end portions of the silicon pillars 5 through the openings 15, thereby forming pillar upper diffusion layers 16. Then, a silicon nitride film is deposited to a thickness of about 10 nm by CVD and then etching back is carried out, thereby forming sidewall films 18 over the inner walls of the openings 15. In the formation of the sidewall films 18, the insulating films 17 formed on the upper surfaces of the silicon pillars 5 are removed to expose the upper surfaces of the silicon pillars. In this event, the insulating films 17 remain under the sidewall films 18 and on the exposed surfaces of the gate electrodes 11a in the openings 15. The sidewall films 18 serve to ensure insulation between the gate electrodes 11a and silicon plugs which will be formed subsequently.

Then, using a selective epitaxial growth method, silicon plugs 19 are grown on the upper surfaces of the silicon pillars 5 so as to fill the openings 15. Thereafter, in the case of an n-type transistor, impurities such as arsenic are implanted to make the silicon plugs 19 serve as an n-type conductor, thereby allowing the silicon plugs 19 to electrically contact the pillar upper diffusion layers 16 formed at the upper end portions of the silicon pillars 5.

Figure 18:
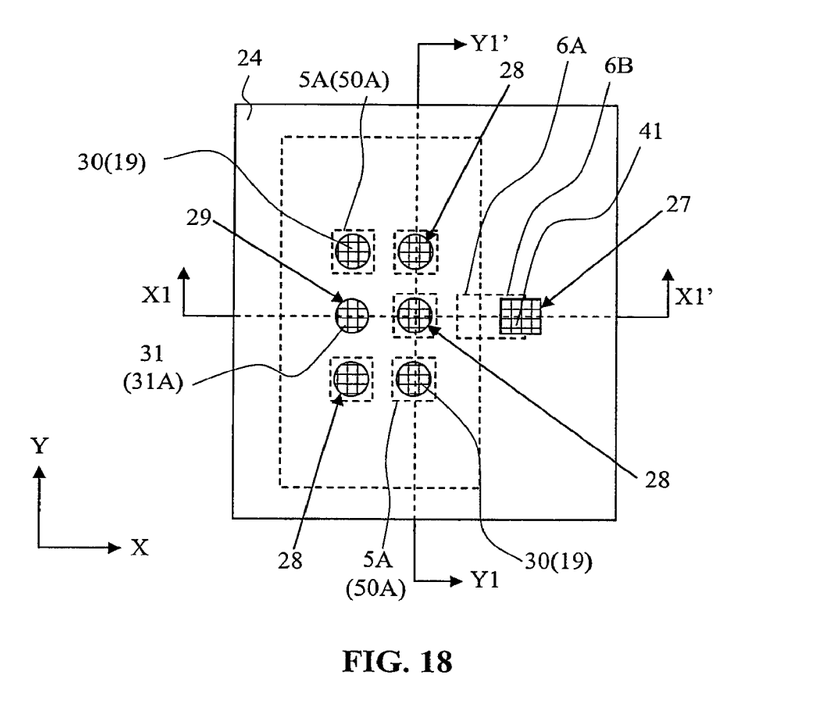
FIG. 18 is a diagram (plan view) for explaining the method of manufacturing the semiconductor device 100 according to the first embodiment, wherein, in order to clarify the arrangement of components, those components underlying an uppermost layer are shown in broken lines.
Figure 19:
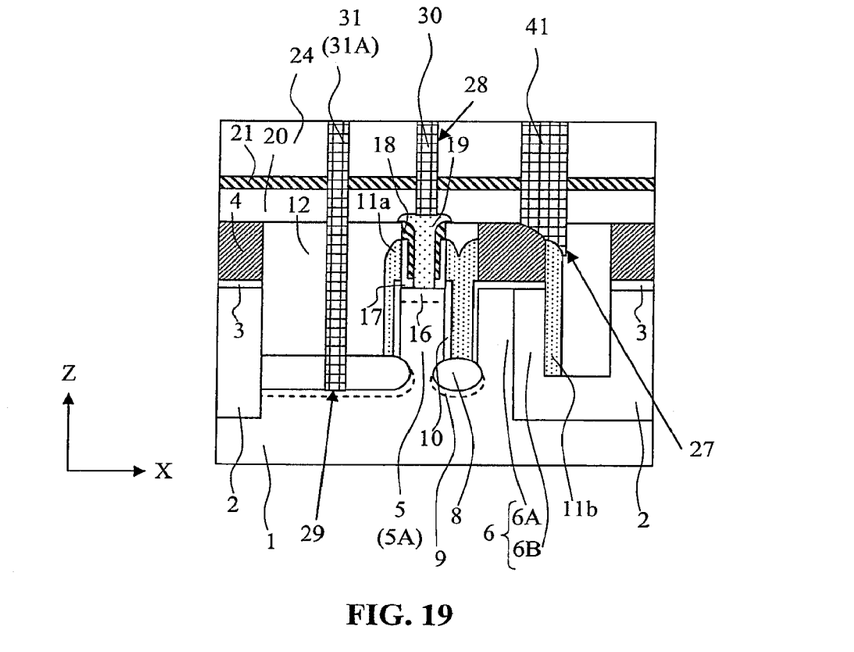
FIG. 19 is a cross-sectional view taken along line X1-X1' of FIG. 18.
Figure 20:
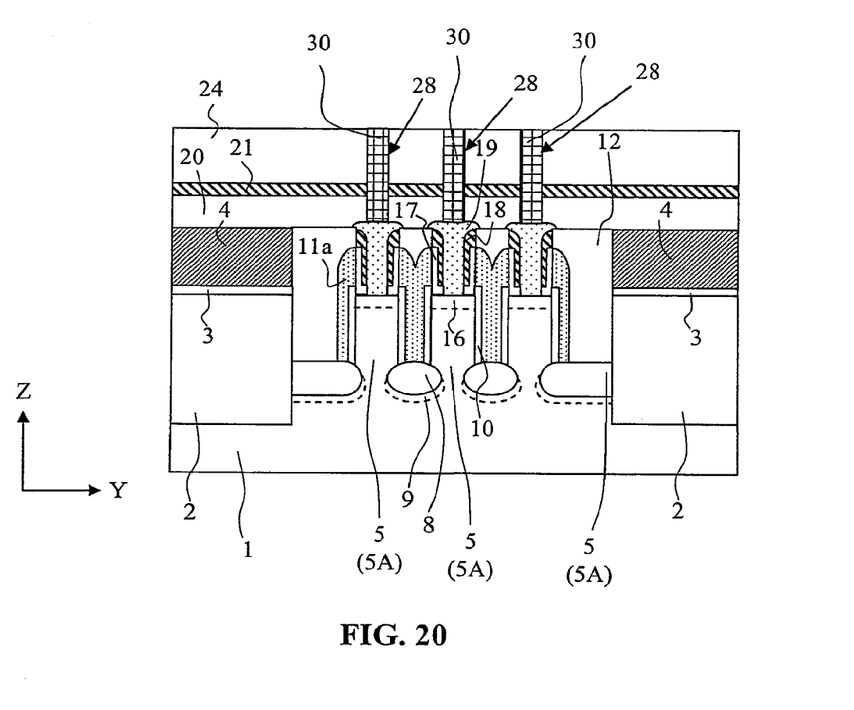
FIG. 20 is a cross-sectional view taken along line Y1-Y1' of FIG. 18.

Then, as shown in FIGS. 18 to 20, a second interlayer insulating film 20 in the form of a silicon oxide film is deposited by CVD so as to bury the opening 14. Then, a stopper film 21 in the form of a silicon nitride film is deposited to a thickness of 20 nm by CVD. Then, a third interlayer insulating film 24 in the form of a silicon oxide film is deposited to a thickness of 150 nm by CVD.

Then, contact holes 27, 28, and 29 are formed by photolithography and dry etching. As shown in FIG. 18, the contact hole 29 has a circular shape in plan view having its center at an intersection between a center line in the Y-direction passing through the centers of the first and fifth silicon pillars $5A_1$ and $5A_5$ and a center line in the X-direction passing through the center of the third silicon pillar $5A_3$. Herein, the diameter of the contact hole 29 is set to 40 nm. Therefore, the closest interval between the outer periphery of the contact hole 29 and each of the first silicon pillar $5A_1$, the third silicon pillar $5A_3$, and the fifth silicon pillar $5A_5$ is 35 nm, which is the minimum interval. In the formation of the contact hole 27, dry etching is once stopped by the stopper film 21 to thereby control the depth to the gate electrode 11 while an upper surface of the dummy pillar 6 is not etched because it is protected by the remaining mask film 4. Since the contact hole 27 is formed at a position offset from the center of the second dummy pillar 6B, the mask film 4 formed above the second dummy pillar 6B and the power feed gate electrode 11b formed on the side surfaces of the second dummy pillar 6B are partially exposed at the bottom of the contact hole 27. The silicon plug 19 is exposed at least partially at the bottom of each contact hole 28 while the pillar lower diffusion layer 9 is partially exposed at the bottom of the contact hole 29. These contact holes 27 to 29 may be formed simultaneously or separately.

Then, a metal film made of tungsten (W), titanium nitride (TiN), and titanium (Ti) is deposited by CVD to cover the third interlayer insulating film 24, thereby burying the contact holes 27 to 29. Then, the metal film on the third interlayer insulating film 24 is removed by CMP, thereby forming metal contact plugs 30 for the silicon plugs 19, a metal contact plug 31 for the pillar lower diffusion layer 9, and a metal contact plug 41 for the power feed gate electrode 11b.

As described before, the diameter of the metal contact plug 31 formed in the contact hole 29 having the diameter of 40 nm becomes 40 nm. Therefore, as shown in FIG. 18, the closest interval between the outer periphery of the metal contact plug 31 and each of the first silicon pillar $5A_1$, the third silicon pillar $5A_3$, and the fifth silicon pillar $5A_5$ is 35 nm, which is the minimum interval. On the other hand, the second silicon pillar $5A_2$ and the fourth silicon pillar $5A_4$ are each located in a direction inclined by 45 degrees from the X-direction with respect to the metal contact plug 31. Therefore, one corner of the rectangular shape of each of the second silicon pillar $5A_2$ and the fourth silicon pillar $5A_4$ is closest to the outer periphery of the metal contact plug 31. In this case, the closest interval therebetween is 57 nm. Herein, the interval between the outer periphery of the metal contact plug 31 and each of the first silicon pillar $5A_1$, the third silicon pillar $5A_3$, and the fifth silicon pillar $5A_5$, the center of which is located on the same center line in the X- or Y-direction as the center of the metal contact plug 31, is 35 nm, which is the minimum interval. On the other hand, the interval between the outer periphery of the metal contact plug 31 and each of the second silicon pillar $5A_2$ and the fourth silicon pillar $5A_4$, each located in the direction inclined by 45 degrees from the center line in the X-direction with respect to the metal contact plug 31, is 57 nm, which is the maximum interval. In this case, since the maximum interval (57 nm) is twice or less the minimum interval (35 nm), it is possible to avoid the prior art problem that the intervals between the metal contact plug 31 and the respective silicon pillars become non-uniform so that parasitic resistances of the lower diffusion layer 9 from the metal contact plug 31 to the respective silicon pillars differ from each other, resulting in unstable characteristics of the entire semiconductor device. If each silicon pillar has a circular shape in plan view having a diameter of 50 nm, the maximum interval becomes 67 nm. Accordingly, even in this case, the maximum interval (67 nm) is twice or less the minimum interval (35 nm) so that it is possible to avoid the above-mentioned problem.

Then, as shown in FIG. 1, metal interconnections 33 and 34 and a gate-lift interconnection 42 made of tungsten (W) and tungsten nitride (WN) are formed by sputtering. In this event, the metal contact plug 41 is connected to the gate-lift interconnection 42. Further, the single metal contact plug 31A connected to the pillar lower diffusion layer 9 is connected to the metal interconnection 34. Further, the five metal contact plugs 30 connected to the pillar upper diffusion layers 16 formed in the five silicon pillars 5 are connected to the metal interconnection 33.

The above is the description of the semiconductor device manufacturing method.

According to the semiconductor devices of the first to fifth embodiments described above, the silicon pillars 5 are uniformly arranged around or near the metal contact plug 31 in plan view. With this configuration, the maximum interval between the metal contact plug 31 and the silicon pillar 5 is twice or less the minimum interval between the metal contact plug 31 and the silicon pillar 5 so that variation in electrical resistance between the metal contact plug 31 and the respective silicon pillars 5 can be set within an allowable value range. Further, it is possible to prevent degradation of characteristics of the vertical transistors and thus to stabilize the operation of the semiconductor device.

Although the inventions has been described above in connection with several preferred embodiments thereof, it will be appreciated by those skilled in the art that those embodiments are provided solely for illustrating the invention, and should not be relied upon to construe the appended claims in a limiting sense.

The invention claimed is:

1. A semiconductor device comprising:
a plurality of semiconductor pillars provided to stand from a semiconductor substrate, each of the semiconductor pillars comprising a channel region;
a gate insulating film and a gate electrode provided over a side surface of each of the semiconductor pillars;
an upper diffusion layer provided at an upper end of each of the semiconductor pillars to serve as one of a source and a drain;
a lower diffusion layer operatively coupled to a lower end of each of the semiconductor pillars to serve as the other of the source and the drain; and
a lower diffusion layer side contact plug connected to the lower diffusion layer, wherein
the semiconductor pillars share the lower diffusion layer and the lower diffusion layer side contact plug, and
the semiconductor pillars are uniformly arranged near the lower diffusion layer side contact plug.

2. The semiconductor device according to claim 1, wherein the gate insulating film and the gate electrode are provided to surround the side surface of each of the semiconductor pillars.

3. The semiconductor device according to claim 1, wherein the semiconductor pillars are uniformly arranged on at least two opposite sides of the lower diffusion layer side contact plug.

4. The semiconductor device according to claim 1, wherein the semiconductor pillars are uniformly arranged so as to surround the lower diffusion layer side contact plug.

* * * * *